United States Patent
Berz et al.

(10) Patent No.: US 8,392,033 B2
(45) Date of Patent: Mar. 5, 2013

(54) SYSTEM UNIT FOR A COMPUTER

(75) Inventors: Arno Berz, Rheinstetten (DE); Bernhard Spuhler, Offenbach (DE)

(73) Assignee: Siemens Aktiengasselschaft, Munich (DE)

(*) Notice: Subject to any disclaimer, the term of this patent is extended or adjusted under 35 U.S.C. 154(b) by 264 days.

(21) Appl. No.: 12/757,195

(22) Filed: Apr. 9, 2010

(65) Prior Publication Data

US 2010/0268398 A1 Oct. 21, 2010

(30) Foreign Application Priority Data

Apr. 20, 2009 (DE) .......... 10 2009 018 076

(51) Int. Cl.
G05D 23/00 (2006.01)
(52) U.S. Cl. .......... 700/300; 700/299
(58) Field of Classification Search .......... 700/299, 700/300

See application file for complete search history.

(56) References Cited

U.S. PATENT DOCUMENTS

| 5,249,741 | A * | 10/1993 | Bistline et al. | 236/49.3 |
| 6,020,820 | A * | 2/2000 | Chiang | 340/584 |
| 6,481,974 | B2 * | 11/2002 | Horng et al. | 417/42 |
| 6,791,209 | B2 * | 9/2004 | Aldridge et al. | 307/65 |
| 6,795,928 | B2 * | 9/2004 | Bradley et al. | 713/320 |
| 6,891,347 | B2 | 5/2005 | Dobbs et al. | |
| 7,859,834 | B2 | 12/2010 | Fukuda et al. | |
| 7,894,191 | B2 * | 2/2011 | Tsuchiya | 361/695 |
| 8,131,902 | B2 * | 3/2012 | Karstens | 710/301 |
| 2003/0046339 | A1 * | 3/2003 | Ip | 709/203 |
| 2003/0220721 | A1 | 11/2003 | Cohen | |
| 2004/0070932 | A1 * | 4/2004 | Dobbs et al. | 361/687 |
| 2007/0180117 | A1 * | 8/2007 | Matsumoto et al. | 709/226 |
| 2007/0260417 | A1 * | 11/2007 | Starmer et al. | 702/136 |
| 2008/0114865 | A1 * | 5/2008 | Rothman et al. | 709/223 |
| 2009/0199580 | A1 * | 8/2009 | Lyon | 62/157 |
| 2009/0228893 | A1 * | 9/2009 | Behrendt et al. | 718/105 |
| 2010/0286843 | A1 * | 11/2010 | Lyon | 700/300 |
| 2010/0321874 | A1 * | 12/2010 | Bhattacharyya et al. | 361/679.5 |

FOREIGN PATENT DOCUMENTS

EP 1 760 722 3/2007

OTHER PUBLICATIONS

Siemens-Katalog ST PC, "Embedded and PC-based Automation", Ausgabe Nov. 2008, Kapitel 3.

* cited by examiner

*Primary Examiner* — Ryan Jarrett
(74) *Attorney, Agent, or Firm* — Cozen O'Connor

(57) ABSTRACT

A system unit for a computer comprising at least one plug-in card provided with components and a ventilator for cooling the components, wherein the system unit is also provided with a controller for setting the ventilator speed as a function of a signal of a temperature sensor. Measures are provided which, irrespective of whether the system unit is integrated in a horizontal or vertical position, such as in a switchgear cabinet, effect a good level of cooling.

7 Claims, 1 Drawing Sheet

SYSTEM UNIT FOR A COMPUTER

BACKGROUND OF THE INVENTION

The invention relates to a system unit for a computer comprising at least one plug-in card provided with components and a ventilator for cooling the components, where the system unit is also provided with a controller for setting the ventilator speed as a function of a signal of a temperature sensor.

Siemens catalog ST PCT, issue November 2008, chapter 3 discloses a conventional system unit of a computer. A control input unit, such as a control input unit comprises a keyboard and/or mouse, as well as at least one display device and other hardware units can be connected to this system unit in the form of a so-called "Rack PC". This system unit is additionally provided with further PCI plug-in cards, and other hardware means, which can be plugged into slots of a motherboard and which are also suited to operate the computer. An airflow generated by a ventilator is provided for cooling the PCI plug-in cards and/or their components, with a controller correspondingly setting the ventilator speed and/or ventilator output as a function of the detected temperature to generate an adequately dimensioned airflow inside the system unit. This known system unit can be integrated, for example, into both a horizontal and a vertical position in a switchgear cabinet or is arranged with a suitable assembly accessory as an Industry Tower PC.

To enable a good cooling effect, irrespective of the position of the system unit, several temperature sensors can be provided, which each detect the respective temperature at its respective location in the system unit and supply the detected temperature to the controller. Here, the controller sets the speed of the ventilator such that the airflow or airflows of the ventilator adequately cool the plug-in cards and/or their components as a function of the detected maximum temperature. It is, however, disadvantageous that a plurality of temperature sensors are needed, where the plurality of temperature sensors have to be arranged at various suitable positions inside the system unit so as to prevent unwanted "hot spots" from forming.

It is known that it is possible to use only one single sensor and to always set the ventilator speed as a function of the detected temperature at a level that is high enough for the cooling to still be adequate, even in cases of a thermally unfavorable installation position. Consequently, however, with this temperature, this ventilator speed is also set in a thermally good installation position. As a result, an increased current requirement occurs, as well as an increased level of noise.

SUMMARY OF THE INVENTION

It is therefore an object of the present invention to provide a system unit for improving the cooling of a computer having plug-in cards arranged in the system unit and/or components arranged hereupon or integrated herein.

This and other objects and advantages are achieved in accordance with the invention by providing the system unit with a controller that also sets a ventilator speed as a function of a signal of a position sensor of the system unit, where the position sensor detects the position of the system unit in a built-in cabinet or at an installation location of the system unit.

In order to ensure that an adequate level of cooling is still provided, irrespective of the position of the system unit on site, it is advantageous if the ventilator speed is no longer required to be set to the most unfavorable position of the system unit within the scope of a factory setting. For example, in the event that a vertical installation of the system unit in a switchgear cabinet is thermally unfavorable, and the system unit is however installed horizontally, the controller reduces the ventilator speed. As a result, the current requirement and the noise level of the ventilator are reduced. Furthermore, the service life of the ventilator and the system unit is extended because of the horizontal installation and the associated ventilator speed associated.

It should be understood that it is also possible to provide the system unit for an automation device, which includes several modules for controlling a technical process. In this process, the term "automation device" is to generally be understood to includes all devices, facilities or systems, in addition to exemplary controllers, such as programmable controllers, process computers or (industrial) computers, as well as drive controllers or frequency converters, as are used or can be used to control, regulate and/or monitor technical processes, such as molding or transporting material, energy or information. Here, energy is consumed or converted by suitable technical facilities, such as sensors or actuators for instance.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawings in which an exemplary embodiment of the invention is shown, explains the invention, its embodiments and advantages in more detail below, in which.

DETAILED DESCRIPTION OF THE PRESENTLY PREFERRED EMBODIMENTS

Figure 1:
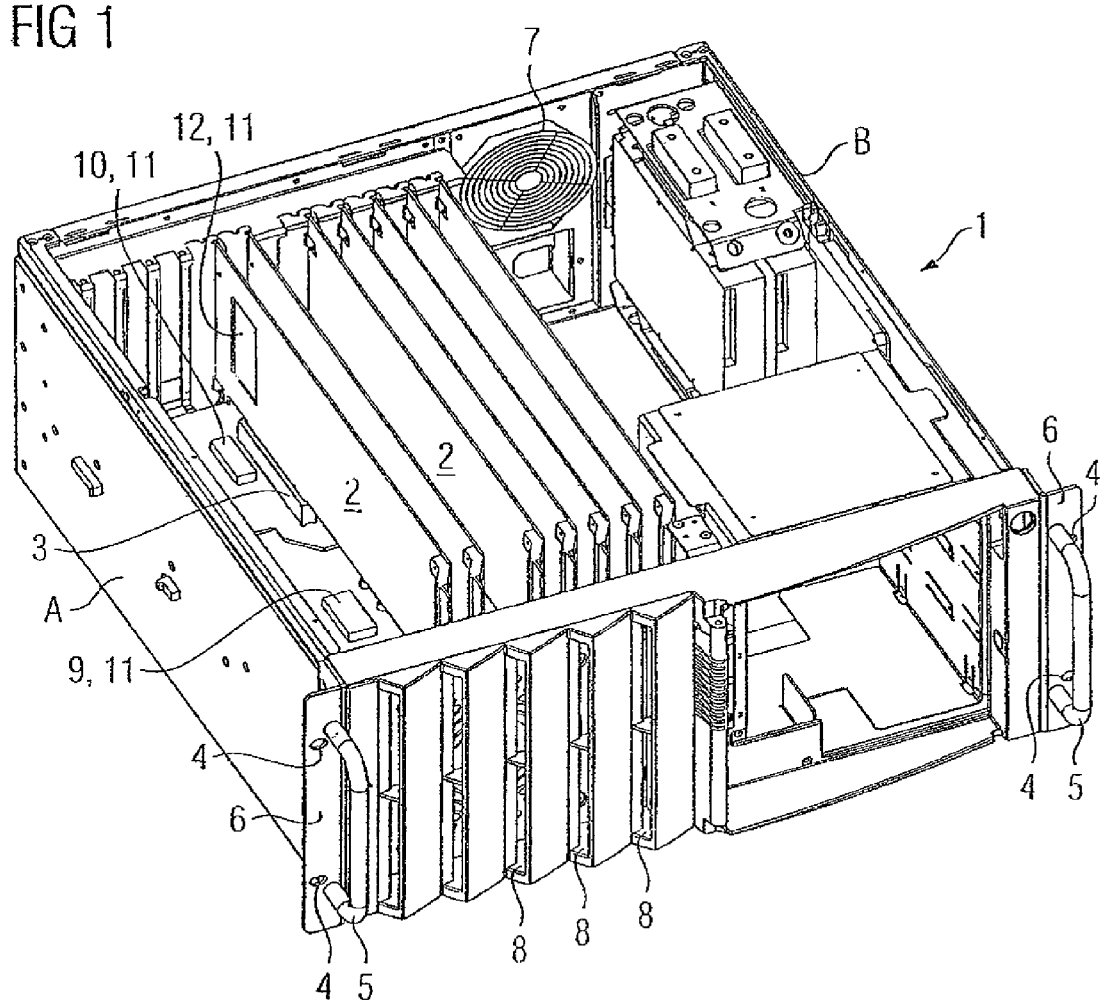
FIG. 1 is a perspective representation of a system unit of a computer in accordance with an embodiment of the invention.
Figure 2:
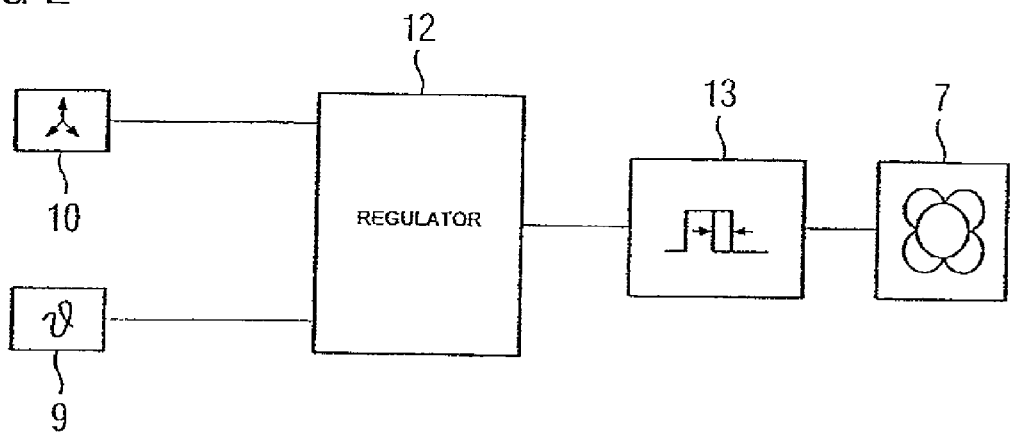
FIG. 2 is a schematic block diagram of a controller for setting the speed of a ventilator in accordance with an embodiment of the invention.

The same parts shown in FIGS. 1 and 2 are provided with the same reference characters. With specific reference to FIG. 1, a system unit 1 of a computer is shown without a cover and without installed floppy disks or hard disk devices. Control input units, such as control input units comprising a keyboard and/or a mouse, as well as at least one image reproduction device and further hardware units can be connected to this system unit 1. The system unit 1 is also provided with so-called PCI plug-in cards 2, which are shown plugged into slots 3 of a motherboard.

It is to be readily understood that the motherboard includes additional slots for receiving additional PCI plug-in cards, such as plug-in cards for implementing Ethernet or field bus communication. Two mounting brackets 6 are provided with holes 4 and handles 5 and are arranged on the front of the system unit 1, by which the system unit 1, for example, can either be integrated horizontally or vertically in a switchgear cabinet (not shown here). Further components of the system unit 1, such as an ac adapter or other hardware means suited to operating the computer, are of no significance for the invention and are therefore are not described here.

In order to cool the PCI plug-in cards 2 and/or their components while the computer is operating, the system unit 1 includes a ventilator speed controller 11 provided with a temperature sensor 9 and a position sensor 10. It should be appreciated that the ventilator speed controller 11 or parts of this controller can be realized on a PCI plug-in card 2, with the ventilator speed controller 11 correspondingly setting the speed of the fan 7 as a function of the temperature detected by the temperature sensor 9 inside the system unit 1 and as a function of the position in which the system unit 1 is installed as detected by the position sensor 10. To this end, the temperature sensor 9 transmits the temperature and the position sensor 10 transmits signals representing the installation position of the system unit 1 (see FIG. 2) to a regulator 12 of the ventilator speed controller 11, which the regulator 12 processes. According to these sensor signals, the regulator 12 generates a pulse-width modulated activation signal 13 and supplies this pulse-width modulated activation signal 13 to the ventilator 7 for speed setting purposes.

In the event that the system unit 1 is arranged vertically or integrated such that side A of the system unit 1 points downwards and side B of the system unit 1 points upwards, the ventilator speed controller 11 sets a first speed. This is first speed is set at a level that is lower than a second speed, which the ventilator speed controller 11 sets in the event that the system unit 1 is arranged, such that side B points downwards and side A points upwards. In this case, the speed is set in this manner because a higher ventilator output is needed to adequately cool the warm air generated by the components of the PCI plug-in cards 2, which moves away from the ventilator in the direction of side A of the system unit 1. In the first instance, the warm air essentially moves in the direction of side B of the system unit, in other words in the direction of the cool air taken in by the ventilator 7.

In the event that the system unit 1 is arranged or installed horizontally, the ventilator speed controller 11 sets a third ventilator speed, which is greater than the first speed but lower than the second speed. That is, the third speed is between the first speed and the second speed.

Selecting the level of the respective ventilator speeds as a function of the installation position and the temperature to ensure effective cooling is determined, for example, within the scope of a factory setting. A plurality of characteristic curves is registered there, which indicate the dependency of the speed on the temperature for different installation positions. Here, the speed that is needed to achieve an effective level of cooling is set for the respective installation position and the respective temperature. In accordance with the invention, these characteristic curves are stored in the regulator 12, where the speed is set during computer operation on site, which is read out from the characteristic curve assigned to this installation position with the currently detected temperature based on the currently detected installation position.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A system unit for a computer, comprising:
   a plug-in card having components;
   a ventilator for cooling the components;
   a temperature sensor;
   a position sensor which detects a position of the system unit one of in a built-in cabinet and in an installation location of the system unit; and
   a controller for setting the ventilator speed as a function of a signal output from the temperature sensor and for setting the ventilator speed as a function of another signal output from the position sensor of the system unit;
   wherein the controller sets a first ventilator speed if the position sensor detects that the system unit is arranged vertically such that a first side of the system unit faces downward and a side opposite to the first side of the system unit faces upward; and
   wherein the controller sets a second ventilator speed that is higher than the first ventilator speed if the position sensor detects that the system unit is arranged such that the side opposite the first side faces downward and the first side faces upward.

2. The system unit of claim 1, wherein the controller comprises a ventilator speed controller.

3. The system unit of claim 2, wherein the ventilator speed controller or parts of the ventilator speed controller is arranged on the plug-in card.

4. The system unit of claim 1, wherein the controller or parts of the controller is arranged on the plug-in card.

5. The system unit of claim 1, wherein the controller includes a regulator which generates a pulse-width modulated activation signal and supplies the pulse-width modulated activation signal to the ventilator for setting the speed of the ventilator.

6. The system unit of claim 5, wherein the temperature sensor transmits a temperature of the controller and the position sensor transmits the other signal to the regulator for processing by the regulator, the other signal indicating the installation location of the system unit.

7. The system unit of claim 1, wherein the controller sets a third ventilator speed which is greater than the first ventilator speed and lower than the second ventilator speed if the position sensor detects that the system unit is arranged horizontally.

* * * * *